United States Patent [19]
Yang et al.

[11] Patent Number: 5,805,624
[45] Date of Patent: Sep. 8, 1998

[54] LONG-WAVELENGTH INFRA-RED VERTICAL CAVITY SURFACE-EMITTING LASER ON A GALLIUM ARSENIDE SUBSTRATE

[75] Inventors: Long Yang, Union City; Danny E. Mars, Los Altos, both of Calif.

[73] Assignee: Hewlett-Packard Company, Palo Alto, Calif.

[21] Appl. No.: 688,338

[22] Filed: Jul. 30, 1996

[51] Int. Cl.$^6$ ................................. H01S 3/19; H01S 3/08
[52] U.S. Cl. ................................. 372/45; 372/96
[58] Field of Search ................................. 372/45, 46, 92, 372/96, 50, 4, 99; 257/13, 97, 98, 103, 201

[56] References Cited

U.S. PATENT DOCUMENTS

| | | | |
|---|---|---|---|
| 4,636,821 | 1/1987 | Yanase et al. | 372/50 |
| 5,351,257 | 9/1994 | Lebby et al. | 372/46 |
| 5,383,211 | 1/1995 | Van de Walle et al. | 372/43 |
| 5,701,321 | 12/1997 | Hayafuji et al. | 372/44 |

FOREIGN PATENT DOCUMENTS

| | | | |
|---|---|---|---|
| 05291698 | 11/1993 | Japan | H01S 3/18 |
| 06037355 | 2/1994 | Japan | H04L 33/00 |
| 7-154023 | 6/1995 | Japan . | |

OTHER PUBLICATIONS

K. Nakahara et al., "Continuous–Wave Operation of Long–Wavelength GaInNAs/GaAs Quantum Well Laser", Electronics Letters, 15 Aug. 1996, vol. 32, No. 17, pp. 1585–1586.

M. Kondow et al., "Extremely Large N Content (up to 10%) in GaNAs Grown by Gas–Source Molecular Beam Epitaxy", Journal of Crystal Growth, vol. 164, 1996, pp. 175–179 (Jul. 1996).

Kondow, M. et al., "A Novel Material of GAINAS for Long–Wavelength–Range Laser Diodes with Excellent High–Temperature Performance", International Conference on Solid State Devices and Materials, Aug. 21, 1995, pp. 1016–1018.

Margalit, N. M. et al., "Laterally Oxidized Long Wavelength CW Vertical–Cavity Lasers", Applied Physics Letters, vol. 69, No. 4, Jul. 22, 1996, pp. 471–472.

Larson, M. C. et al., "Room Temperature Continuous Wave Photopumped Operation of 1.22 mum GaLnNAs/GaAS Single Quantum Well Vertical Cavity Surface Emitting Laser", Electronics Letters, vol. 33, No. 11, May 22, 1997, pp.959–960.

*Primary Examiner*—Rodney B. Bovernick
*Assistant Examiner*—Quyen Phan Leung
*Attorney, Agent, or Firm*—Ian Hardcastle

[57] ABSTRACT

A vertical cavity surface emitting laser (VCSEL) that generates light having a desired wavelength, greater than one micron. The laser comprises a substrate, a lower mirror region, an active region and an upper mirror region. The substrate consists essentially of GaAs. The lower mirror region is adjacent the substrate and is lattice matched to the substrate. The active region is sandwiched between the upper and lower mirror regions, and includes a central quantum well region and a gallium arsenide layer sandwiched between the quantum well region and each of the lower mirror region and the upper mirror region. The central quantum well region includes a quantum well layer consisting essentially of $GaN_xAs_{(1-x)}$. The $GaN_xAs_{(1-x)}$ of the quantum well layer has a lattice constant and a band gap dependent on x. The value of x sets the bandgap of the $GaN_xAs_{(1-x)}$ of the quantum well layer to a value corresponding to light generation at the desired wavelength, greater than one micron. Each gallium arsenide layer is a layer of a material consisting essentially of GaAs or AlGaAs, and is lattice matched to the substrate. The quantum well layer may additionally include a fraction of indium to lattice match the quantum well layer to the substrate.

12 Claims, 2 Drawing Sheets

LONG-WAVELENGTH INFRA-RED VERTICAL CAVITY SURFACE-EMITTING LASER ON A GALLIUM ARSENIDE SUBSTRATE

FIELD OF THE INVENTION

The invention relates to light-generating semiconductor devices, and, in particular, to a vertical cavity surface-emitting laser that generates infra-red light at wavelengths greater than one micron and is constructed on a gallium arsenide substrate.

BACKGROUND OF THE INVENTION

Semiconductor light-emitting devices, such as vertical cavity surface-emitting lasers (VCSELs), are manufactured using several substrate materials. These materials include gallium arsenide (GaAs), gallium phosphide (GaP), and indium phosphide (InP). A light-emitting device is made by epitaxially growing various materials having different bandgaps on the substrate. By selecting the appropriate materials, a light-emitting device is formed that generates light at the required wavelength. However, to obtain high quality light-emitting devices, the materials grown on the substrate must be closely lattice matched to the substrate. If materials grown on the substrate are pseudomorphic, i.e., not lattice matched to the substrate, the thickness of the layers of the grown materials must be limited to prevent dislocations from occurring in the grown materials.

Gallium arsenide is the most common, lowest cost, and most practical substrate material for use in making light-emitting devices. However, due to the requirements that layers of materials grown on the substrate be lattice matched to the substrate to prevent dislocations in the grown layers, the wavelengths obtainable from light-emitting devices made by growing materials in the aluminum, indium, gallium, arsenide, phosphide (AlInGaAsP) material system on a GaAs substrate are limited to the range from 0.6 $\mu$m to 1.0 $\mu$m.

The glasses used as the core material for the optical fibres used in long-haul optical fiber communication systems have their maximum transmissivity at infra-red wavelengths substantially longer than one micron, i.e., substantially longer than the wavelengths that can be generated by devices made by growing layers of materials in the (AlInGaAsP) material system on a GaAs substrate. The most common wavelengths used in long-haul optical fiber communication systems are 1.3 $\mu$m and 1.55 $\mu$m. Light-emitting devices generating light at these wavelengths have up to now been grown on InP substrates.

Indium phosphide has several disadvantages as a substrate material. First, InP substrates are considerably more expensive than GaAs substrates of the same size. Second, InP substrates are not available in such large diameters as GaAs substrates. This results in a greater per-device fabrication cost. Third, InP substrates are more brittle than GaAs substrates, and so have greater production costs due to wafer handling losses than GaAs substrates. Fourth, VCSELS made on InP substrates have inferior performance to VCSELS made on GaAs substrates, primarily because distributed Bragg reflectors made in materials lattice matched to InP have a significantly lower reflectivity and electrical conductivity than distributed Bragg reflectors made in materials lattice matched to GaAs. Aluminum arsenide (AlAs) is lattice matched to GaAs, and the large refractive index difference between AlAs and GaAs enables high-reflectivity distributed Bragg reflectors to be made using relatively few pairs of alternating $\lambda/4n$-thick AlAs and GaAs layers. In this, $\lambda$ is the wavelength, in vacuo, of the light generated by the VCSEL, e.g., 1.3 $\mu$m or 1.55 $\mu$m, and n is the refractive index of the layer. Distributed Bragg reflectors made of alternating AlAs and GaAs layers are both electrically and thermally conductive, and enable high-performance 0.78 $\mu$m to 0.98 $\mu$m VCSELS to be made. However, the much smaller refractive index difference between InP and materials lattice-matched to InP means that a distributed Bragg reflector made using InP requires about 40–60 pairs of layers to provide the same reflectivity as an AlAs/GaAs reflector with 20–30 pairs of layers. The electrical and thermal conductivity of distributed Bragg reflectors with such a large number of layers is so low that adequate device efficiency cannot be attained, and the light output of the device is limited by thermal considerations.

Accordingly, it is desirable to be able to make light-emitting devices that generate light at wavelengths longer than 1.0 $\mu$m by growing layers of materials on GaAs substrates.

SUMMARY OF THE INVENTION

The invention provides a vertical cavity surface emitting laser (VCSEL) that generates light having a desired wavelength, greater than one micron. The laser comprises a substrate, a lower mirror region, an active region and an upper mirror region. The substrate consists essentially of GaAs. The lower mirror region is adjacent the substrate and is lattice matched to the substrate. The active region is sandwiched between the upper and lower mirror regions, and includes a central quantum well region and a gallium arsenide layer sandwiched between the quantum well region and each of the lower mirror region and the upper mirror region. The central quantum well region includes a quantum well layer consisting essentially of $GaN_xAs_{(1-x)}$. The $GaN_xAs_{(1-x)}$ of the quantum well layer has a lattice constant and a band gap dependent on x. The value of x sets the bandgap of the $GaN_xAs_{(1-x)}$ of the quantum well layer to a value corresponding to light generation at the desired wavelength, greater than one micron. Each gallium arsenide layer is a layer of a material consisting essentially of GaAs or AlGaAs, and is lattice matched to the substrate.

The VCSEL according to the invention generates infra-red light at a wavelength greater than one micron, yet is formed on a substrate of GaAs. High quality GaAs substrates are readily available, and are more rugged and far less expensive than InP substrates. The VCSEL includes a lower mirror region of materials that are lattice matched to the GaAs substrate. Such a lower mirror region can be made using GaAs and AlAs. The large refractive index difference between these materials enables the lower mirror region to have a high electrical and thermal conductivity because relatively few pairs of layers are required. The VCSEL generates light at a wavelength of greater than one micron using a quantum well layer of gallium nitride arsenide $GaN_xAs_{(1-x)}$, where x is less than 0.1. The band gap of this material is sufficiently low for light generation at such wavelengths, and its lattice constant is sufficiently close to that of GaAs that a strained thin layer will adopt the lattice constant of GaAs without dislocations of the crystal structure occurring.

The VCSEL according to the invention generates light in a preferred wavelength range between about 1.1 $\mu$m and 1.6 $\mu$m, and the value of x is preferably between 0.01 and 0.1. With values of x of about 0.03 and 0.04, the VCSEL generates light at wavelengths of 1.3 $\mu$m and 1.55 $\mu$m, respectively. These wavelengths are the most common wavelengths used in long-haul optical fiber communication systems.

The $GaN_xAs_{(1-x)}$ of the quantum well layer has a critical thickness that depends on the value of x. The critical thickness of a strained layer is the thickness of the layer at which dislocations of the crystal structure begin to occur. The quantum well layer has a thickness of less than the critical thickness.

The quantum well layer may be lattice matched to the gallium arsenide layer by the quantum well layer being a layer of a material consisting essentially of gallium indium nitride arsenide $Ga_{(1-y)}In_yN_xAs_{(1-x)}$. The lattice constant and band gap of the $Ga_{(1-y)}In_yN_xAs_{(1-x)}$ of the quantum well layer depend on x and y. The values of x and y set the lattice constant of the $Ga_{(1-y)}In_yN_xAs_{(1-x)}$ of the quantum well layer to match the lattice constant of the material of the gallium arsenide layers, and set the bandgap of the $Ga_{(1-y)}In_yN_xAs_{1-x}$ of the quantum well layer to a value corresponding to light generation at the desired wavelength, greater than one micron.

The value of y may be as high as unity, in which case the quantum well layer is a layer of a material consisting essentially of indium nitride arsenide $Ga_{(0)}In_1N_xAs_{(1-x)}$. The value of x sets the lattice constant of the $Ga_{(1-y)}In_yN_xAs_{(1-x)}$ of the quantum well layer to match the lattice constant of the material of the gallium arsenide layers.

The quantum well layer may alternatively be lattice matched to the gallium arsenide layer by the quantum well layer being a layer of a material consisting essentially of aluminum gallium indium nitride arsenide $Al_zGa_{(1-y-z)}In_yN_xAs_{(1-x)}$. The lattice constant and band gap the $Al_zGa_{(1-y-z)}In_yN_xAs_{(1-x)}$ of the quantum well layer depend on x, y and z. The values of x, y and z set the lattice constant of the $Al_zGa_{(1-y-z)}In_yN_xAs_{(1-x)}$ of the quantum well layer to match the lattice constant of the material of the gallium arsenide layers, and set the bandgap of the $Al_zGa_{(1-y-z)}In_yN_xAs_{(1-x)}$ of the quantum well layer to a value corresponding to light generation at the desired wavelength, greater than one micron.

The sum of y and z in the $Al_zGa_{(1-y-z)}In_yN_xAs_{(1-x)}$ may be unity, in which case, the quantum well layer is a layer of aluminum indium nitride arsenide $Al_zGa_{(0)}In_yN_xAs_{(1-x)}$. The values of y and z set the lattice constant of the $Al_zGa_{(1-y-z)}In_yN_xAs_{(1-x)}$ of the quantum well layer to match the lattice constant of the material of the gallium arsenide layers, and set the bandgap of the $Al_zGa_{(1-y-z)}In_yN_xAs_{(1-x)}$ of the quantum well layer to a value corresponding to light generation at the desired wavelength, greater than one micron.

DETAILED DESCRIPTION OF THE INVENTION

Figure 1A:
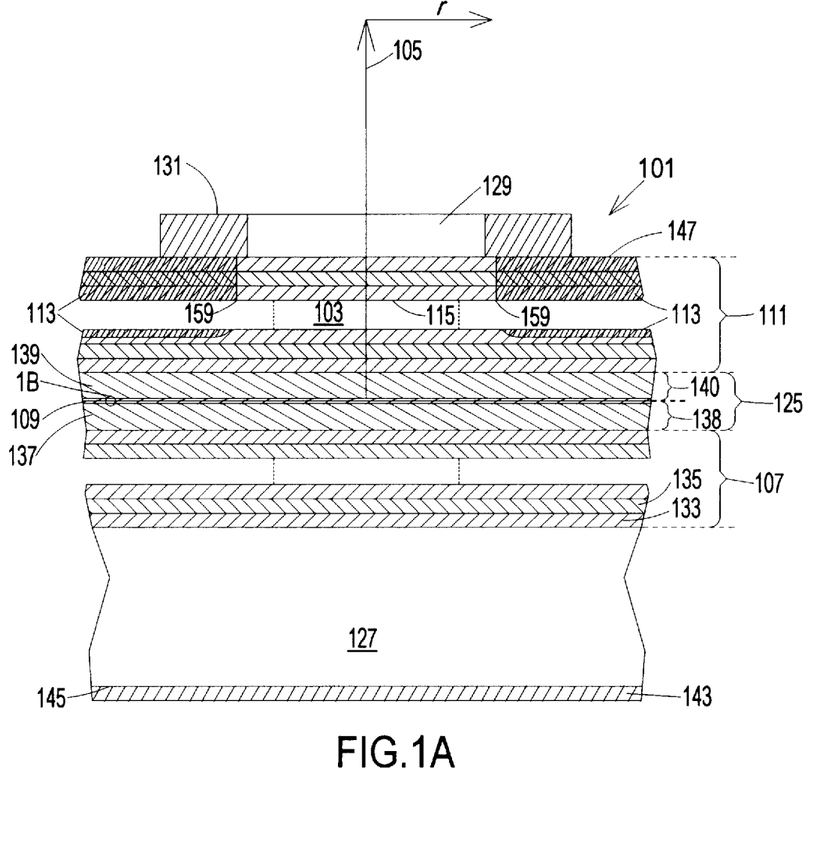
FIG. 1A is a cross-sectional view of a VCSEL according to the invention.

FIG. 1A shows an embodiment 101 of a vertical cavity surface emitting laser (VCSEL) according to the invention. The VCSEL 101 generates infra-red light of wavelength λ that is radiated along the optical axis 105. The VCSEL is composed of the gallium arsenide (GaAs) substrate 127, the lower mirror region 107 adjacent the substrate, and the upper mirror region 111. The upper and lower mirror regions include layers of GaAs or aluminum gallium arsenide (AlGaAs). The active region 125 is sandwiched between the upper and lower mirror regions. The active region, the lower mirror region and the upper mirror region collectively constitute the optical cavity 103, the lateral extent of which in the radial direction r, perpendicular to the optical axis, is defined by the low-conductivity zone 113, which surrounds the core zone 115. The active region is composed of the light-generating region 109 sandwiched between the lower cladding layer 137 and the upper cladding layer 139. The cladding layers are a doped portion of the gallium arsenide layers 138 and 140. The gallium arsenide layers may alternatively be layers of AlGaAs.

The light-generating region 109 is centered in the active region 125, and is composed of the quantum well region 155 sandwiched between the lower separate confinement heterojunction (SCH) layer 151 and the upper SCH layer 153. The lower and upper SCH layers are respectively undoped portions of the lower and upper gallium arsenide layers 138 and 140. The quantum well region is composed of at least one quantum well layer 157 of gallium nitride arsenide $GaN_xAs_{(1-x)}$ which has a lower bandgap than gallium arsenide. The bandgap of gallium nitride arsenide decreases as the fraction of nitrogen x increases. In the VCSEL 101, the fraction of nitrogen in the gallium nitride arsenide of the quantum well layer is that which gives a bandgap corresponding to light generation at a desired wavelength, greater than one micron. For example, a nitrogen fraction of about 0.03 gives a bandgap of 0.95 eV, which corresponds to light generation at 1.3 μm, a nitrogen fraction of 0.04 gives a bandgap of 0.8 eV, which corresponds to light generation at 1.55 μm. In the VCSEL 101, the thickness of the layers in the upper and lower mirror regions and the thickness of the active layer all correspond to the wavelength of the light generated by the quantum well region.

Gallium nitride arsenide has a smaller lattice constant than gallium arsenide, since some of the arsenic atoms in gallium arsenide are replaced with nitrogen atoms, which have a substantially smaller covalent bonding distance. Accordingly, there is lattice mismatch between gallium nitride arsenide and pure gallium arsenide. The lattice mismatch increases as the fraction of nitrogen is increased above zero. For example, in the VCSEL 101, there is a lattice mismatch between the gallium nitride arsenide of the quantum well layer 155 and the GaAs or AlGaAs of the gallium arsenide layers 138 and 140 and the mirror regions 107 and 111, and the GaAs of the substrate 127. However, the lattice mismatch is small at nitrogen fractions less than about 10%, so that with layer thicknesses less than about 100 Å, the lattice mismatch can be accommodated by strain in the layers instead of by dislocations. Despite the lattice mismatch, the quantum well layer will grow on the lower gallium arsenide layer 138 without dislocations, and the upper gallium arsenide layer 140 and the layers of the upper mirror region 111 will grow on the quantum well layer without dislocations.

If strain in the quantum well layer 155 is undesirable, indium gallium nitride arsenide may alternatively be used as the material of the quantum well layer. The fractions of indium and nitrogen in the indium gallium nitride arsenide may be set to provide the material of the quantum well layer with a band gap corresponding to light emission at the desired wavelength, greater than one micron, e.g., 1.3 μm or 1.55 μm, and a lattice constant equal to that of the GaAs or AlGaAs of the adjacent gallium arsenide layers 138 and 140.

FIG. 1A shows a cross sectional view of the VCSEL 101 in the plane of the optical axis 105 and perpendicular to the plane of the light-generating region 109. It should be noted that FIGS. 1A and 1B do not show the VCSEL to scale. The thicknesses of all the layers of the VCSEL except the substrate 127 have been increased to show the layers more clearly. In actual devices, the thickness of the substrate is approximately 500 μm, while the combined thickness of the lower and upper mirror regions 107 and 111 and the active region 125 is about 6–7 μm. The light emission port 129 in the electrode 131 is typically about 10 μm across. Moreover, since the lower mirror region 107 and the upper mirror region 111 each typically include tens of layers, most of the layers have been omitted from the depiction of these regions to simplify the drawing. Also, since the thickness of the light-generating region 109 is small compared with that of the active region 125, the light generating region is shown in more detail in FIG. 1B. Finally, the terms upper and lower are respectively used in this description to denote remoteness or proximity of various elements relative to the substrate 127, and not to indicate any particular spatial orientation.

The VCSEL 101 is one of many VCSELs formed simultaneously by processing operations that epitaxially grow a succession of layers on the surface of a GaAs wafer to form a layer structure. After the layer structure has been formed, the individual VCSELs are defined in the layer structure by implanting to form a low-conductivity zone defining the core zone of each VCSEL. The wafer with the layer structure formed on its surface is then divided into individual VCSELs or arrays of VCSELs.

The substrate 127 is a small part of a wafer of GaAs typically about 500 μm thick and about 50–75 mm in diameter. The lower mirror region 107 is preferably a distributed Bragg reflector, as shown in FIG. 1A. Distributed Bragg reflectors have a periodic structure of thin semiconductor or dielectric layers with alternating higher and lower refractive indices. For example, the distributed Bragg reflector constituting the lower mirror region 107 may consist of 32.5 pairs of alternating AlAs and GaAs layers, for example, the layers 133 and 135, epitaxially grown on the substrate 127. The layers of AlAs and GaAs are preferably grown by molecular beam epitaxy (MBE) or metal-organic chemical vapor deposition (MOCVD). Each layer of the distributed Bragg reflector constituting the lower mirror region has a physical thickness of $q\lambda/4n_1$, where $n_1$, is the refractive index of the material of the layer, and q is an odd integer. Aluminum gallium arsenide (AlGaAs), which has almost the same lattice constant as that of GaAs, may be used in the lower mirror region instead of AlAs or instead of GaAs. Two different forms of AlGaAs, each with a different fraction of aluminum, may also be used instead of both the AlAs and GaAs. Finally, AlGaAs may be used between the AlAs and the GaAs in the lower mirror region to increase the electrical conductivity of the lower mirror region.

The active region 125 is grown on the lower mirror region 107. The active region has a total thickness of $p\lambda/2n_2$ where $n_2$ is the average refractive index of the materials of the active region, and p is an integer. The active region is composed of the light-generating region 109 sandwiched between the lower cladding layer 137 and the upper cladding layer 139. The lower cladding layer is a layer of doped GaAs epitaxially grown on the lower mirror region, preferably by MBE or MOCVD. The light-generating region 109 is undoped, and is grown on the lower cladding layer. The light-generating region will be described in more detail below. The upper cladding layer is a layer of GaAs epitaxially grown on the light-generating region, preferably by MBE or MOCVD. Aluminum gallium arsenide may be used instead of gallium arsenide in the upper and lower cladding layers. As noted above, the lower and upper cladding layers consitute doped portions of the lower and upper gallium arsenide layers 138 and 140. The lower and upper gallium arsenide layers also respectively include the lower and upper SCH layers, part of the light generating region 109.

The upper mirror region 111 is preferably a distributed Bragg reflector, as shown in FIG. 1A. For example, the distributed Bragg reflector constituting the upper mirror region 111 may consist of 20 pairs of alternating AlAs and GaAs layers epitaxially grown on the active region 125, preferably by MBE or MOCVD. Each layer of the distributed Bragg reflector constituting the upper mirror layer has a physical thickness of $q\lambda/4n_1$, where $n_1$ is the refractive index of the material of the layer, and q is an odd integer. Aluminum gallium arsenide may be used in the upper mirror region similarly to its use, described above, in the lower mirror region.

The upper mirror region 111 may alternatively be a distributed Bragg reflector composed of alternating dielectric layers, for example, layers of silicon dioxide $SiO_2$ and titanium dioxide $TiO_2$. Silicon nitride $Si_3N_4$ may be used instead of silicon dioxide. A distributed Bragg reflector composed of alternating dielectric layers has fewer pairs of layers than a distributed Bragg reflector composed of alternating semiconductor layers of equal reflectivity.

The materials of the lower and upper mirror regions 107 and 111, the materials of the lower and upper cladding layers 137 and 139 of the active region 125, and the material of the substrate 127 are doped with suitable dopants to make them electrically conductive. The lower mirror region is doped with either a p-type dopant or an n-type dopant, and the upper mirror region is doped with the opposite type of dopant. The lower cladding layer is doped to have the same conductivity type (p-type or n-type) as the lower mirror layer. The upper cladding layer is doped to have the same conductivity type as the upper mirror layer. The light generating layer 109 is undoped. Therefore, the mirror regions 107 and 111, their adjacent cladding layers 137 and 139, and the light-generating region 109 collectively form a p-i-n or an n-i-p diode.

The substrate 127 is doped with an n-type dopant. If the lower mirror region 107 is doped with a p-type dopant, an additional pair of layers (not shown), repectively degeneratively doped with a p-type dopant and an n-type dopant to form a tunnel junction, is interposed between the lower mirror region and the substrate. The tunnel junction provides a conduction path with a low voltage drop between the lower mirror region and the substrate.

The lower mirror region 107, the upper mirror region 111 and the active region 125 form the optical cavity 103 in which the distributed Bragg reflectors constituting the lower and upper mirror regions 107 and 111 reflect most of the light generated in the light-generating region 109 back into the active region 125. Wave interference within the layers of the distributed Bragg reflectors reduces the light to standing waves of wavelength λ. By making the distributed Bragg reflector constituting the upper mirror region 111 less than totally reflective, coherent light having a wavelength of λ is emitted along the optical axis 105 perpendicular to the plane of the light-generating region 109.

The low-conductivity zone 113 is formed in the upper mirror region 111 by ion implantation, preferably performed using hydrogen ions. Ions of other suitable elements, such as helium or oxygen, may alternatively be used. Because ion implantation disrupts the crystal structure, the low-reflectivity zone does not usually extend into the active region 125, but stops short in the upper mirror region as shown.

The low-conductivity zone 113 may alternatively be defined by forming a native oxide region surrounding the core zone 115 in at least one layer of the upper mirror region 111.

The low-conductivity zone 113 defines the lateral extent of the optical cavity 103 in the plane of the light-generating region 109. The lateral extent of the optical cavity corresponds approximately to the boundary 159 between the core zone 115 and the low-conductivity zone. The implantation in the low-conductivity zone causes the upper mirror region to have a lower electrical conductivity in the low-conductivity zone than in the core zone. This confines the flow of laser current through the upper mirror region to the core zone, and also confines the flow of laser current through the active region 125 to a zone substantially coextensive with the core zone.

The electrode 131 is a metallized electrode of the appropriate type for the conductivity type of the material of the upper mirror region 111, and is located on the surface 147 of the upper mirror region, remote from the active region 125. The electrode is centered on the optical axis 105. The electrode is formed to include the light emission port 129 through which the light generated by the VCSEL is emitted. The light emission port is also centered on the optical axis, and has a lateral extent less than that of the core zone 115 so that part of the electrode 131 overlaps the core zone to provide a low resistance path for current to flow between the electrode and the core zone. The top layer of the upper mirror region may be a current-spreading layer composed of highly-doped GaAs that provides a highly-conductive path between the electrode and the core zone.

An upper mirror region 111 composed of a distributed Bragg reflector having alternating dielectric layers is non-conductive, and requires that the electrode 131 contact the active region 125 directly.

The electrode 143 is located on the back surface 145 of the substrate 127, and is a metallized electrode of the appropriate type for the conductivity type of the substrate.

Figure 1B:
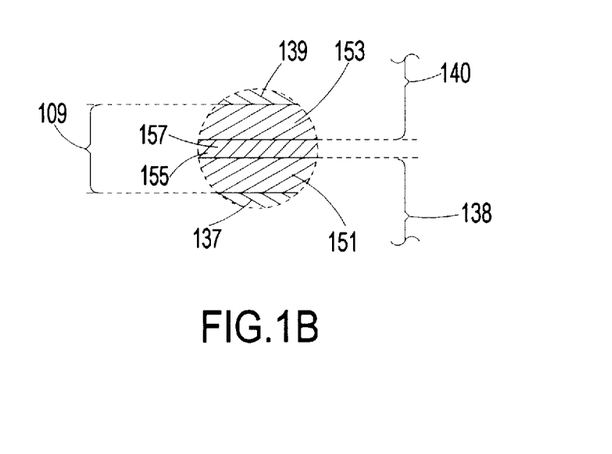
FIG. 1B is an enlarged cross-sectional view of part of the quantum well region of a VCSEL according to the invention.

The light-generating region 109 is shown in greater detail in FIG. 1B. The light-generating region is located centrally in the active region 125. The light-generating region is composed of the quantum well region 155 sandwiched between the lower separate confinement heterojunction (SCH) layer 151 and the upper SCH layer 153. To simplify the drawing, FIG. 1B shows a single quantum well structure in which the quantum well region is composed of the single quantum well layer 157. However, a multiple quantum well structure, in which the quantum well region is composed of multiple quantum well layers separated by respective barrier layers, increases the optical gain of the light-generating region. In a multiple quantum well structure, at least one additional quantum well layer and a respective barrier layer (not shown) is interposed between the quantum well layer 157 and one of the adjacent SCH layers.

The lower SCH layer 151 and the upper SCH layer 153 are preferably layers of GaAs or AlGaAs and constitute an undoped portion of the lower gallium arsenide layer 138 and the upper gallium arsenide layer 140, respectively. The lower gallium arsenide layer is grown using doped GaAs or AlGaAs to form the lower cladding layer 137, and the lower SCH layer is formed by continuing the growth process with the supply of the dopant turned off. The upper gallium arsenide layer is grown on the quantum well region 155, initially using undoped GaAs or AlGaAs to form the upper SCH layer. The upper cladding layer 139 is then formed by turning a supply of a suitable dopant on and continuing the growth of the upper gallium arsenide layer.

The quantum well layer 157 is a layer of gallium nitride arsenide $GaN_xAs_{1-x}$. Gallium arsenide has a band gap of 1.42 eV, which corresponds to light emission at a wavelength of less than one micron. Gallium nitride arsenide in which the fraction of nitrogen is in the range of about 0.01–0.1, i.e., $0.01 \leq x \leq 0.1$, has a band gap that corresponds to light emission at wavelengths of greater than one micron. For example, a nitrogen fraction x of about 0.03 results in a band gap of about 0.95 eV, which corresponds to light emission at a wavelength of about 1.3 $\mu$m, and a nitrogen fraction of about 0.04 results in a band gap of about 0.8 eV, which corresponds to light emission at a wavelength of about 1.55 $\mu$m.

A nitrogen fraction x of greater than zero in gallium nitride arsenide $GaN_xAs_{1-x}$ causes a lattice mismatch between the gallium nitride arsenide of the quantum well layer 157 and the GaAs or AlGaAs of the adjacent gallium arsenide layers 138 and 140. Nitrogen has a much smaller covalent radius than arsenic, so replacing some of the arsenic atoms in gallium arsenide with nitrogen atoms causes the resulting gallium nitride arsenide to have a smaller lattice constant from that of gallium arsenide. However, with a value of x of about 0.03, which is sufficient to provide gallium nitride arsenide with a bandgap low enough for light emission at a wavelength of 1.3 $\mu$m, and a quantum well layer thickness of less than about 100 Å, the resulting lattice mismatch can simply be accommodated by strain in the layers.

Increasing the nitrogen fraction decreases the critical thickness at which lattice defects, such as dislocations, occur in the quantum well layer. Lattice defects allow the quantum well layer to relax to its natural, unstrained lattice constant, but disrupt the electrical parameters of the light-generating region 109, and may impair the reliability of the VCSEL. For example, a nitrogen fraction x significantly higher than about 0.1 may result in a critical thickness less than the desired thickness of the quantum well layer. Accordingly, the fraction of nitrogen in the gallium nitride arsenide and the thickness of the quantum well layer are set to prevent such dislocations. A higher maximum nitrogen fraction can be used if the thickness of the quantum well layer is small. In a practical embodiment, the nitrogen fraction was about 0.03 and the quantum well layer 157 was about 80 Å thick.

If strain in the quantum well layer 157 is undesirable, or if the nitrogen fraction required to produce the band gap corresponding to the desired wavelength results in a critical thickness less than the desired thickness of the quantum well layer, the quantum well layer has to be lattice matched to the adjacent gallium arsenide layers 138 and 140. The lower gallium arsenide layer is lattice matched to the lower mirror region 107 and the substrate 127. This can be done by using gallium indium nitride arsenide $Ga_{1-y}In_yN_xAs_{1-x}$ as the material of the quantum well layer. Indium has a greater covalent bonding radius than gallium, so substituting some of the gallium atoms in gallium nitride arsenide with indium atoms results in gallium indium nitride arsenide with a greater lattice constant than pure gallium nitride arsenide with the same value of x. The increase in the lattice constant depends on the indium fraction y. With an appropriate choice of the values of the nitrogen fraction x and the indium fraction y, the lattice constant of gallium indium nitride arsenide can be matched that of the gallium arsenide substrate 127, and its band gap can be set to that corresponding to light emission at the desired wavelength, greater than one micron. For example, M. Kondow et al., *GaInNAs: a Novel Material for Long-Wavelength Range Laser Diodes with Excellent High-Temperature Performance*, 35 JP. J. APPL. PHYS., 1273–1275 (1996 February) report photoluminescence at about 1230 Å from a 70 Å single quantum well structure with a quantum well layer of $Ga_{0.7}In_{0.3}N_{0.01}As_{0.99}$. A nitrogen fraction of about 0.03, corresponding to light generation at about 1.3 μm, would require a larger value of the indium fraction y to maintain lattice matching with the GaAs or AlGaAs of the adjacent gallium arsenide layers 138 and 140. A nitrogen fraction of about 0.04, corresponding to light generation at about 1.55 μm, would also require a larger value of the indium fraction y to maintain lattice matching with the GaAs or AlGaAs of the adjacent gallium arsenide layers 138 and 140.

Other materials with the potential for lattice matching with GaAs or AlGaAs, and having a band gap sufficiently low for light generation at desired wavelengths greater than one micron include aluminum indium nitride arsenide $Al_{1-y}In_yN_xAs_{1-x}$, and aluminum gallium indium nitride arsenide $Al_zGa_{1-y-z}In_yN_xAs_{1-x}$.

As a further alternative, indium nitride arsenide, $InN_xAs_{1-x}$, may be used as the material of the quantum well layer 157. With an appropriate choice of the value of x, indium nitride arsenide has a lattice constant that matches that of the GaAs or AlGaAs of the adjacent gallium arsenide layers 138 and 140. Indium nitride arsenide also has a band gap sufficiently low for light generation at wavelengths greater than one micron. The lattice constant of gallium arsenide is 5.66 Å, and that of aluminum gallium arsenide is very similar. The lattice constant of indium arsenide is 6 Å, whereas that of indium nitride is 5 Å. Thus, the lattice constant of indium nitride arsenide $InN_xAs_{1-x}$ can be made to match that of gallium arsenide or aluminum gallium arsenide by selecting the appropriate value of x.

The bandgap of indium arsenide is 0.36 eV and that of indium nitride is 2.2 eV. Thus, values of the fraction x of nitrogen in indium nitride arsenide $InN_xAs_{1-x}$ below a first threshold value result in a band gap less than or equal to 0.95 eV, which corresponds to light generation at 1.3 μm, and values below a second threshold value result in a band gap less than or equal to 0.8 eV, which corresponds to light generation at 1.55 μm. However, the value of x at which the lattice constant of an indium gallium arsenide quantum well layer 157 matches that of the GaAs or AlGaAs of the adjacent gallium arsenide layers 138 and 140 may not be the value of x that results in a band gap corresponding to light generation at the desired wavelength, greater than one micron, e.g., 1.3 or 1.55 μm. Adding gallium, aluminum or both gallium and aluminum to indium nitride arsenide results in a material that is lattice matched to the GaAs or AlGaAs of the gallium arsenide layers 138 and 140 and has a bandgap corresponding to light generation at a desired wavelength, greater than one micron, e.g., 1.3 or 1.55 μm, as described above. The fraction of gallium and/or aluminum that must be added to produce the desired band gap and lattice constant depends on the thickness of the quantum well layer.

Figure 2:
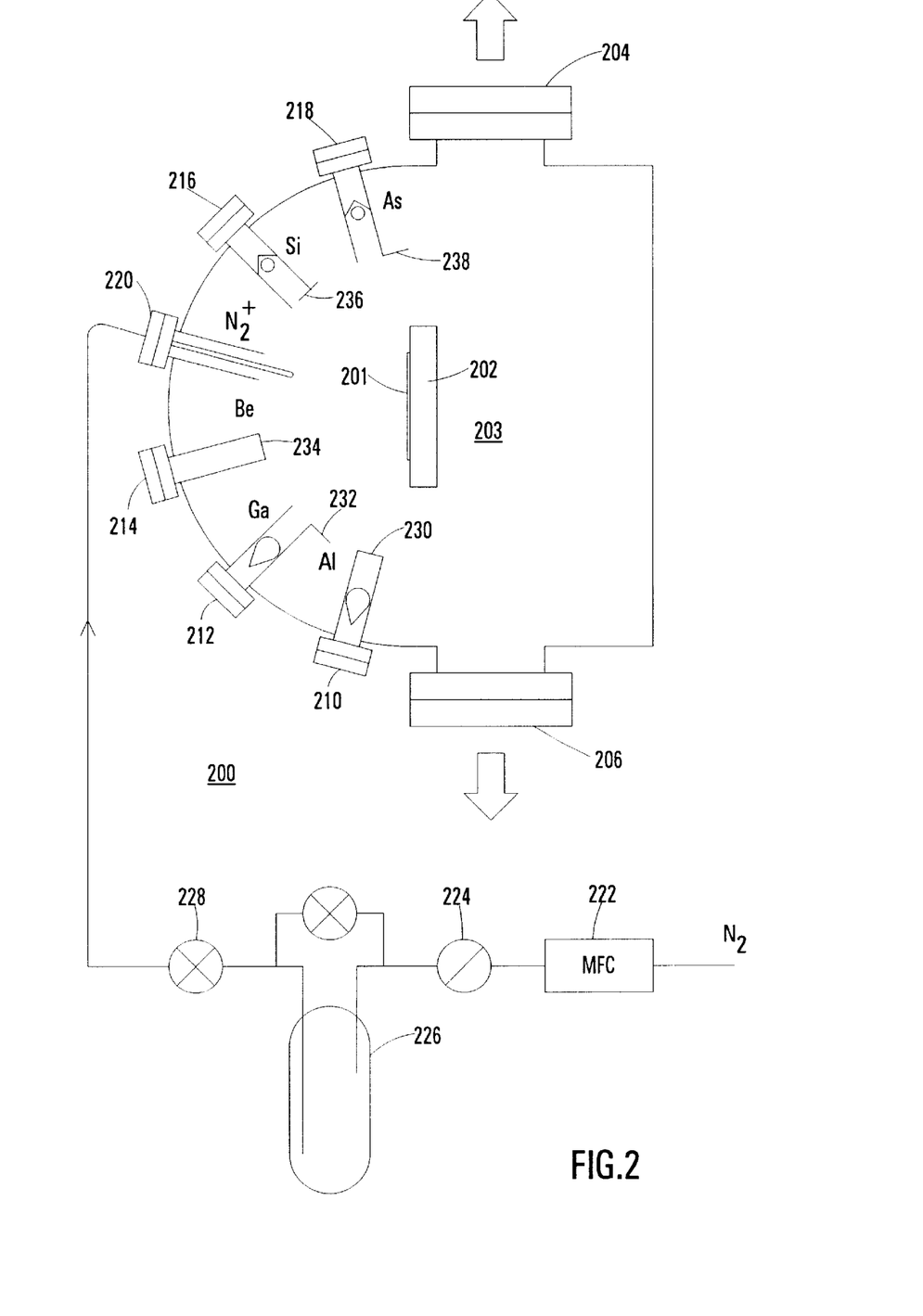
FIG. 2 is a schematic depiction of a system that can be used for growing the layer structure including a layer of GaNAs in which VCSELs according to the invention are made.

FIG. 2 shows the arrangement of an example of a system that may be used to make long-wavelength infra-red VCSELs having at least one gallium nitride arsenide quantum well layer. A similar system can be used to make long-wavelength infra-red VCSELs having at least one gallium indium nitride arsenide, aluminum indium nitride arsenide, or aluminum gallium indium nitride arsenide quantum well layer. The system shown is used to make multiple VCSELs simultaneously on a gallium arsenide wafer by epitaxially growing a layer structure on the wafer using gas-source molecular beam epitaxy (MBE). The layer structure may alternatively be grown on the wafer in other ways, such as metal-organic chemical vapor deposition (MOCVD), using a different type of system. After the layer structure has been grown on the wafer, the wafer with its layer structure is divided into individual VCSELs by implantation to form a low-conductivity zone that surrounds the core zone of each VCSEL. The back side of the wafer is metallized, and an electrode connected to the core zone of each VCSEL is formed on the top surface of the layer structure. Finally, the wafer with its layer structure is physically divided into individual VCSELs or VCSEL arrays.

In the system 200 shown in FIG. 2, the wafer 201 is mounted on the wafer holder 202 located inside the growth chamber 203. Included in the wafer holder, but not shown, are elements for heating the wafer to a predetermined temperature and for measuring the temperature of the wafer.

The interior of the growth chamber 203 is connected to an ion pump and a cryo pump (not shown) via the outlets 204 and 206, respectively. These pumps maintain a base pressure in the range of about $10^{-10}$ to about $10^{-11}$ torr inside the growth chamber. However, the pressure will rise above the base pressure when fluxes of atoms are introduced into the growth chamber. The system includes a series of load locks (not shown) to enable wafers to be introduced into the interior of the growth chamber without exposing the interior to atmospheric contamination.

A number of effusion cells, for example, the effusion cells 210, 212, 214, 216 and 218, also communicate with the interior of the growth chamber 203 and face the wafer 201. Effusion cells are also known in the art as Knudsen cells (K-cells) or source furnaces. Each effusion cell is the source of a flux of atoms or molecules of a different chemical element that will be a constituent of the materials of the layers grown on the surface of the wafer 201. Although not shown, each effusion cell includes a heating element for heating the chemical element in the effusion cell to a predetermined temperature, and a temperature sensor for measuring the temperature of the chemical element in the effusion cell. The effusion cells 210, 212, 214, 216 and 218 respectively include the remotely-operated shutters 230, 232, 234, 236 and 238 that control the flux of atoms or molecules generated by the effusion cell.

A respective chemical element is placed in solid form in each effusion cell. In the example of the system 200 shown in FIG. 2, aluminum is placed in the effusion cell 210, gallium is placed in the effusion cell 212, beryllium is placed in the effusion cell 214, silicon is placed in the effusion cell 216, and arsenic is placed in the effusion cell 218.

The chemical element in each of the effusion cells 210–218 is heated by the heating element to a predetermined temperature to generate the flux of atoms or molecules directed towards the wafer 201. Whether the flux is of atoms or molecules depends on the element. To simplify the following description, atoms and molecules will be referred to collectively as "atoms." The flux of the atoms from each effusion cell depends on the temperature of the effusion cell and the position of the shutter of the effusion cell.

Other systems may have more or fewer effusion cells than shown in FIG. 2. For example, if the material of the quantum well layer 157 is gallium indium nitride arsenide, an additional effusion cell for generating a flux of indium atoms is required.

The system 200 also includes the electron cyclotron resonance (ECR) plasma source 220 that provides the nitrogen constituent of gallium nitride arsenide. The ECR plasma source will be described in more detail below.

Operation of the system 200 to grow the layer structure from which the VCSEL 100 is formed will now be described with reference to FIGS. 1 and 2. In the VCSEL 100, the lower mirror region 107 is composed of alternating layers of AlAs and GaAs or AlGaAs epitaxially grown on the GaAs substrate 127. Hence, the first layer of the layer structure grown on the wafer 201 is a layer of AlAs. To grow the first layer of AlAs on the wafer, a small part of which will constitute the substrate 127 of the VCSEL 101, wafer is mounted on the substrate holder 202 in the interior of the growth chamber 203. The wafer is then heated to a temperature between about 500° C. and 700° C.

The effusion cell 210 is heated to a temperature at which it generates the required flux of aluminum atoms. To provide a growth rate of about 1 $\mu$m/hour, a flux of about $6 \times 10^{14}$ aluminum atoms/cm$^2$/sec is required. The effusion cell 218 is heated to a temperature at which it generates a substantially greater flux of arsenic atoms than the flux of aluminum atoms generated by the effusion cell 210. The fluxes of atoms impinge on the surface of the wafer and atoms from the fluxes bond to the wafer and to one another to form an epitaxial layer of AlAs having the same crystalline structure as that of the GaAs of the wafer. Excess arsenic atoms that have not bonded to corresponding aluminum atoms are removed by the pumps connected to the outlets 204 and 206 or are deposited on the inside walls of the growth chamber 203.

In addition, the effusion cell 214 and the effusion cell 216 are heated to a temperature at which they respectively generate beryllium or silicon atoms at a flux of between about $10^{-6}$ and about $10^{-1}$ of that of the flux of aluminum atoms generated by the effusion cell 210. Then, either the shutter 234 of the effusion cell 214 or the shutter 236 of the effusion cell 216 is opened to provide a flux of dopant to dope the layer of AlAs. If the shutter 234 of the effusion cell 214 is opened, the flux of beryllium atoms dopes the AlAs p-type, whereas if the shutter 236 of the effusion cell 216 is opened, the flux of silicon atoms dopes the AlAs n-type.

The effusion cell 212 is also heated to a temperature at which it generates a flux of gallium atoms comparable to the flux of aluminum atoms generated by the effusion cell 210. When the layer of AlAs reaches the required thickness of $\lambda/4n_3$, where $\lambda$ is the desired wavelength of the light to be generated by the VCSEL (e.g., 1.3 or 1.55 $\mu$m) and $n_3$ is the refractive index of AlAs, the shutter 232 of the effusion cell 212 is opened to admit the flux of gallium atoms into the growth chamber 203, and, at the same time, shutter 230 on the effusion cell 210 is closed to switch off the flux of aluminum atoms entering the growth chamber. The flux of atoms from the effusion cells 218 and either 214 or 216 is maintained. The gallium and arsenic atoms deposit on the AlAs layer to form GaAs having the same crystalline structure as that of the AlAs layer, and, hence, of the underlying GaAs wafer. Beryllium atoms or silicon atoms from the effusion cell 214 or 216, respectively, dope the GaAs to have the same conductivity type as that of the AlAs just deposited. Excess arsenic atoms that have not bonded to corresponding gallium atoms are removed by the pumps connected to the outlets 204 and 206 or are deposited on the inside walls of the growth chamber.

When the layer of GaAs reaches the required thickness of $\lambda/4n_4$, where $n_4$ is the refractive index of GaAs, another layer of AlAs is grown on the layer of GaAs by opening the shutter 230 of the effusion cell 210 and closing the shutter 232 of the effusion cell 212 to replace the flux of gallium atoms with a flux of aluminum atoms. The flux of atoms from the effusion cells 218 and either 214 or 216 is maintained.

The shutters 230 and 232 of the effusion cells 210 and 212, respectively, are cycled as just described about 30 times to form the lower mirror region 107 composed of about 30 pairs of alternating doped AlAs and GaAs layers.

In the course of growing the lower mirror region 107, the shutters 230 and 232 of the effusion cells 210 and 212, respectively, may be positioned so that fluxes of both aluminum atoms and gallium atoms are simultaneously directed towards the wafer 201 so that layers of AlGaAs can be grown instead of, or in addition to, the layers of AlAs and GaAs, as described above.

When growth of the lower mirror region 107 is complete, a layer of GaAs or AlGaAs is then grown in the way just described on the top layer of the lower mirror region to form the lower gallium arsenide layer 138. The lower gallium arsenide layer is initially doped with a flux of dopant from the effusion cell 214 or 216 to have the same conductivity type as the lower mirror region and to form the lower cladding layer 137.

When the part of the lower gallium arsenide layer 138 constituting the lower cladding layer 137 reaches its required thickness, the shutter 234 or 236 of the respective effusion cell 214 or 216 supplying the dopant is closed to switch off the flux of dopant. However, the flux from the effusion cells 212 and 218 is maintained to continue growing the gallium arsenide layer by growing additional, undoped, GaAs or AlGaAs on the lower cladding layer to form the lower SCH layer 151.

When the lower SCH layer has reached a thickness in the range of about 500–1,000 Å, a layer of gallium nitride arsenide is grown on the lower gallium arsenide layer 138 to form the quantum well layer 157. The shutters 232 and 238 of the effusion cells 212 and 218, respectively, are kept open to provide respective streams of gallium atoms and arsenic atoms. However, gallium nitride arsenide cannot simply be made by directing a stream of nitrogen molecules towards the heated wafer 201, together with the fluxes of gallium atoms and arsenic atoms. Molecular nitrogen is too stable for its constituent atoms to bond to the gallium atoms when the nitrogen molecules contact the heated wafer. A wafer temperature of over 3,500° C. would be required to break the nitrogen molecule into its constituent atoms. The system 200 therefore lacks a simple injector for nitrogen gas molecules. Instead, the electron cyclotron resonance (ECR) plasma source 220 is used to generate a stream of ionized nitrogen molecules and excited nitrogen molecules for injection into the growth chamber 203. Ionized nitrogen molecules and excited nitrogen molecules readily bond with gallium atoms on contact with the heated wafer.

Nitrogen gas from a suitable source (not shown) is passed via the mass flow controller (MFC) 222, the valve 224, the gas purification filter 226, and the valve 228 to the ECR plasma source 220. The ECR plasma source subjects the electrons of the nitrogen gas molecules to microwave energy at a frequency of about 2.45 GHz, which is their cyclotron resonance frequency. This ionizes some of the nitrogen molecules and excites others of the nitrogen molecules to a higher-energy state. The resulting stream of such molecules passes from the ECR plasma source 220 into the growth chamber 203 and meets the streams of gallium atoms and arsenic atoms at the surface of the heated wafer 201. The constituent atoms of such nitrogen molecules bond with the gallium atoms on contact with the heated wafer. The flow of nitrogen into the ECR plasma source is set such that nitrogen atoms constitute a fraction of between 0.01 and 0.1 of the combined arsenic and nitrogen atoms. The flow is set such that nitrogen atoms constitute a fraction of about 0.03 of the combined arsenic and nitrogen atoms when the VCSEL 101 is to generate light at 1.3 µm, and about 0.04 of the combined arsenic and nitrogen atoms when the VCSEL 101 is to generate light at 1.55 µm.

The optical gain of the VCSEL 101 is highly dependent on the optical quality of the layer structure of the VCSEL, and, in particular, on the optical quality of the quantum well region 155. The optical quality of the quantum well region depends in turn on the quality of the crystal structure of the material of the quantum well layer 157. Moreover, the optical quality of the layers grown on the quantum well layer depends on the quality of the crystal structure of the quantum well layer. Thus, the quantum well layer must be grown in a way that provides a high-quality crystal structure. The ECR plasma source 220 can generate nitrogen ions and excited nitrogen atoms with sufficient energy to disrupt the crystal structure of the gallium nitride arsenide of the quantum well layer. Accordingly, it is desirable to minimize the power level of the microwave energy fed to the ECR plasma source so that the nitrogen ions and excited nitrogen atoms are generated at as low an energy as possible. Moreover, the ECR plasma source may incorporate a graphite electrode to moderate the energy of the nitrogen ions and improve the optical quality of the quantum well layer. As a further alternative, lower-energy nitrogen ions and excited nitrogen atoms may be generated using an RF plasma source. As a yet further alternative, a stream of a chemical source of nitrogen such as ammonia or hydrogen azide may be directed towards the surface of the wafer 201. If ammonia is used as the nitrogen source, it can be pre-cracked prior to injection into the growth chamber 203, or it can be cracked by the temperature of the wafer.

The above-described layer structure may be epitaxially grown on the wafer 201 using MOCVD instead of gas source MBE. When MOCVD is used, hydrazine, dimethyl hydrazine, or ammonia may be used as nitrogen precursors in forming the quantum well layer 157.

When the quantum well layer 157 is grown, the temperature of the wafer 201 may be changed from that at which the lower mirror region 107 and the lower gallium arsenide layer 138 were grown. The quality of the crystal structure of the quantum well layer is optimized by growing the quantum well layer with the wafer at as high a temperature as possible. This temperature may be as high as about 800° C. when the quantum well layer is a layer of gallium nitride arsenide grown by gas-source MBE. Temperatures as high as about 1100° C. may be used when a gallium nitride arsenide quantum well layer is grown using MOCVD. These maximum temperatures must be reduced when the quantum well layer includes indium. For example, de-sorption of indium may occur at temperatures above about 600° C. when a layer of gallium indium nitride arsenide is grown by gas-source MBE.

Growth of the gallium nitride arsenide layer is continued until the quantum well layer 157 reaches the required thickness in the range of 50–100 Å. The flow of nitrogen gas to the ECR plasma source 220 is then turned off. Alternatively, the flow of nitrogen gas may be maintained and the supply of microwave energy to the ECR plasma source turned off. The resulting non-ionized/non-excited nitrogen molecules do not combine with the gallium atoms on contact with the heated wafer 201, and are removed from the growth chamber 203 by the pumps connected to the outlets 204 and 206.

When the flow of nitrogen gas or the microwave energy supply is turned off, the shutters 232 and 238 of the effusion cells 212 and 218, respectively, are kept open to grow a layer of GaAs on the gallium nitride arsenide of the quantum well layer. Also, the shutter 230 of the effusion cell 210 may be re-opened to grow a layer of AlGaAs instead of a layer of GaAs. Because the gallium nitride arsenide of the quantum well layer is strained, and has the same lattice constant as the underlying lower gallium arsenide layer 138, the layer of GaAs or AlGaAs grows epitaxially on top of the quantum well layer with the same crystal structure as that of the lower gallium arsenide layer.

If the light-generating region 109 is to have a multiple quantum well structure, growth of the layer of GaAs or AlGaAs on the quantum well layer 157 is stopped with the layer reaches a thickness of about 300 Å. This layer (not shown) then constitutes a barrier layer between the quantum well layer and an adjacent additional quantum well layer (not shown). The additional quantum well layer is grown on the barrier layer by switching on the supply of nitrogen gas or the supply of microwave energy to the ECR plasma source 220 and continuing growth until the additional quantum well layer reaches a thickness in the range of about 50–100 Å. Several layer pairs, each composed of a GaAs or AlGaAs barrier layer and a gallium nitride arsenide additional quantum well layer, may be grown on the quantum well layer 157 as just described.

Irrespective of whether the light-generating region 109 has a multiple quantum well structure or a single quantum well structure, a layer of GaAs or AlGaAs is grown on the uppermost quantum well layer (or the quantum well layer 157 in a single quantum well structure) to form the upper gallium arsenide layer. The GaAs or AlGaAs initially deposited is undoped, and constitutes the upper SCH layer 153.

When the upper SCH layer 153 reaches its required thickness in the range of 500–1000 Å, shutter 234 of the effusion cell 214 or the shutter 236 of the effusion cell 216 is opened, and the shutters 232 and 238 of the effusion cells 212 and 218, respectively, are kept open to continue growth of the upper gallium arsenide layer 140 to form the upper cladding layer 139. The shutter 230 of the effusion cell 210 may also be opened or kept open to provide an additional stream of aluminum atoms. Beryllium atoms from the effusion cell 214 or silicon atoms from the effusion cell 216 dope the upper cladding layer for the opposite conductivity type to that of the lower cladding layer 139 and lower mirror region 107. Therefore, if the shutter 234 of the effusion cell 214 was open when the lower mirror region and lower cladding layer were grown, the shutter 236 of the effusion cell 216 is opened when the upper cladding layer is grown. Alternatively, if the shutter 236 of the effusion cell 216 was open when the lower mirror region and lower cladding layer were grown, the shutter 234 of the effusion cell 214 is opened when the upper cladding layer is grown.

When the upper cladding layer 139 reaches such a thickness that the total thickness of the active region 125 is an integral multiple of $\lambda/2n_2$, where $\lambda$ is the wavelength of the light generated by the VCSEL and $n_2$ is the average refractive index of the materials constituting the active region, a layer of AlAs constituting the first layer of the upper mirror region 111 is grown on the upper gallium arsenide layer 140. The AlAs layer is grown by opening the shutter 230 of the effusion cell 210 and closing the shutter 232 of the effusion cell 212 to switch off the flux of gallium atoms. The shutters of the effusion cells 218 and either 214 or 216 are kept open.

The shutters 230 and 232 of the effusion cells 210 and 212, respectively, are cycled about 20 times to form the upper mirror region 111. The upper mirror region is composed of about 20 pairs of alternating AlAs and GaAs or AlGaAs layers. The shutter 234 or 236 of the effusion cell 214 or 216 may be further opened during growth of the final one or two layers to increase the doping level so that this layer or these layers act as a current spreading layer. Growing the final layer of the upper mirror region completes formation of the layer structure on the wafer 201.

In the course of growing the upper mirror region 111, the shutters 230 and 232 of the effusion cells 210 and 212, respectively, may be positioned so that fluxes of both aluminum atoms and gallium atoms are simultaneously directed towards the wafer 201 so that layers of AlGaAs can be grown instead of, or in addition to, the layers of AlAs and GaAs, as described above.

The top surface 147 of the upper mirror region 111 of the layer structure is then masked to define the core zone of each VCSEL on the wafer. Ions, such as hydrogen ions, are then implanted through the top surface to form the low conductivity zone that surrounds the core zone of each VCSEL. For example, the mask defines the core zone 115 of the VCSEL 101, and ions are implanted to form the low conductivity zone 113 surrounding the core zone of the VCSEL 101.

The top surface 147 of the upper mirror region 111 of the layer structure and bottom surface 145 of the wafer are then metallized with a metal such as gold or aluminum. The layer of metal deposited on the top surface of the upper mirror region is then masked to define the annular electrode of each VCSEL on the wafer. For example, the mask defines the annular electrode 131 of the VCSEL 101. The layer of metal is then etched to form the electrodes. Finally, the wafer is divided into individual VCSELs, including the VCSEL 101, or into arrays of VCSELs.

Although this disclosure describes illustrative embodiments of the invention in detail, it is to be understood that the invention is not limited to the precise embodiments described, and that various modifications may be practiced within the scope of the invention defined by the appended claims.

We claim:

1. A vertical cavity surface emitting laser (VCSEL), comprising:
   a substrate consisting essentially of GaAs;
   a lower mirror region adjacent the substrate and lattice matched thereto;
   an upper mirror region; and
   an active region sandwiched between the upper and lower mirror regions, the active region including:
      a central quantum well region including a quantum well layer consisting essentially of $GaN_xAs_{(1-x)}$, the $GaN_xAs_{(1-x)}$ of the quantum well layer having a lattice constant and a band gap dependent on x, x having a value of approximately 0.04 that sets the bandgap of the $GaN_xAs_{(1-x)}$ of the quantum well layer to a value corresponding to light generation at a wavelength of 1.55 microns, and
      a gallium arsenide layer sandwiched between the quantum well region and each of the lower mirror region and the upper mirror region, each gallium arsenide layer being a layer of a material consisting essentially of one of GaAs and AlGaAs, having a lattice constant, and being lattice matched to the substrate.

2. The VCSEL of claim 1, in which:
   the $GaN_xAs_{(1-x)}$ of the quantum well layer has a critical thickness dependent on the value of x; and
   the quantum well layer has a thickness of less than the critical thickness.

3. A vertical cavity surface emitting laser (VCSEL), comprising:
   a substrate consisting essentially of GaAs;
   a lower mirror region adjacent the substrate and lattice matched thereto;
   an upper mirror region;
   an active region sandwiched between the upper and lower mirror regions, the active region including:
      a central quantum well region including a quantum well layer of a Group III–V semiconductor material that comprises a fraction y of a first Group III element, a second Group III element, a fraction x of nitrogen and a fraction (1–x) of arsenic, in which y>0, the semiconductor material of the quantum well layer having a lattice constant and a band gap dependent on x and y, and
      a gallium arsenide layer sandwiched between the quantum well region and each of the lower mirror region and the upper mirror region, each gallium arsenide layer being a layer of a material consisting essentially of one of GaAs and AlGaAs, having a lattice constant, and being lattice matched to the substrate:
   in which
   x and y have values that set the lattice constant of the semiconductor material of the quantum well layer to match the lattice constant of the material of the gallium arsenide layers, and set the bandgap of the semiconductor material of the quantum well layer to a value corresponding to light generation at a wavelength of greater than one micron.

4. The VCSEL of claim 3, in which:
   the semiconductor material of the quantum well layer additionally comprises a fraction z of a third Group III element, in which y>0 and z>0, the semiconductor material of the quantum well layer having a lattice constant and a band gap dependent on x, y and z; and
   x, y and z have values that set the lattice constant of the semiconductor material of the quantum well layer to match the lattice constant of the material of the gallium arsenide layers, and set the bandgap of the semiconductor material of the quantum well layer to a value corresponding to light generation at a wavelength greater than one micron.

5. The VCSEL of claim 8, in which:
   the first Group III element is indium;
   the second Group III element is gallium; and
   the third Group III element is aluminum.

6. The VCSEL of claim 3, in which:
   the first Group III element is indium; and
   the second Group III element is gallium.

7. The VCSEL of claim 3, in which:
   the first Group III element is aluminum; and
   the second Group element is gallium.

8. The VCSEL of claim 3, in which:
   the first Group III element is indium; and
   the second Group III element is aluminum.

9. A vertical cavity surface emitting laser (VCSEL), comprising:
   a substrate consisting essentially of GaAs;

a lower mirror region adjacent the substrate and lattice matched thereto:

an upper mirror region; and an active region sandwiched between the upper and lower mirror regions, the active region including:

a central quantum well region including a quantum well layer consisting essentially of $InN_xAs_{(1-x)}$, the $InN_xAs_{(1-x)}$ of the quantum well layer having a lattice constant and a band gap dependent on x, and a gallium arsenide layer sandwiched between the quantum well region and each of the lower mirror region and the upper mirror region, each gallium arsenide layer being a layer of a material consisting essentially of one of GaAs and AlGaAs, having a lattice constant, and being lattice matched to the substrate; in which x has a value that sets the lattice constant of the $InN_xAs_{(1-x)}$ of the quantum well layer to match the lattice constant of the material of the gallium arsenide layers and that sets the bandgap of the $InN_xAs_{(1-x)}$ of the quantum well layer to a value corresponding to light generation at a wavelength of greater than one micron.

10. A vertical cavity surface emitting laser (VCSEL), comprising:

a substrate consisting essentially of GaAs;

a lower mirror region adjacent the substrate and lattice matched thereto;

an upper mirror region; and an active region sandwiched between the upper and lower mirror regions, the active region including:

a central quantum well region including a quantum well layer consisting essentially of $Ga_{(1-y)}In_yN_xAs_{(1-x)}$, the $Ga_{(1-y)}In_yN_xAs_{(1-x)}$ of the quantum well layer having a lattice constant and a band gap dependent on x and y; x and y having values that set the lattice constant of the $Ga_{(1-y)}In_yN_xAs_{(1-x)}$ of the quantum well layer to match the lattice constant of the substrate, and set the bandgap of the $Ga_{(1-y)}In_yN_xAs_{(1-x)}$ of the quantum well layer to a value corresponding to light generation at a wavelength in the range of 1.1 to 1.6 micron, x having a value in the range $0.01 \leq x \leq 0.1$, and a gallium arsenide layer sandwiched between the quantum well region and each of the lower mirror region and the upper mirror region, each gallium arsenide layer being a layer of a material consisting essentially of one of GaAs and AlGaAs, having a lattice constant, and being lattice matched to the substrate.

11. The VCSEL of claim 10, in which:

the desired wavelength is 1.3 μm; and the value of x is about 0.03.

12. The VCSEL of claim 10, in which:

the desired wavelength is 1.55 μm; and the value of x is about 0.04.

* * * * *